United States Patent
Kim et al.

(10) Patent No.: US 8,105,892 B2
(45) Date of Patent: Jan. 31, 2012

(54) THERMAL DUAL GATE OXIDE DEVICE INTEGRATION

(75) Inventors: Byeong Y. Kim, Hopewell Junction, NY (US); Michael P. Chudzik, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 12/542,768

(22) Filed: Aug. 18, 2009

(65) Prior Publication Data

US 2011/0042751 A1 Feb. 24, 2011

(51) Int. Cl.
*H01L 21/8238* (2006.01)

(52) U.S. Cl. ........ 438/216; 438/199; 438/213; 438/261; 438/275; 438/279; 438/283; 438/285; 438/287; 438/591; 257/369; 257/392

(58) Field of Classification Search ........... 438/199, 438/213, 216, 261, 275, 279, 283, 285, 287, 438/591; 257/369, 392
See application file for complete search history.

(56) References Cited

U.S. PATENT DOCUMENTS

| | | | |
|---|---|---|---|
| 6,037,222 A * | 3/2000 | Huang et al. | 438/257 |
| 7,023,055 B2 | 4/2006 | Ieong et al. | |
| 7,329,923 B2 | 2/2008 | Doris et al. | |
| 7,361,543 B2 * | 4/2008 | Steimle et al. | 438/201 |
| 7,445,981 B1 | 11/2008 | Karve et al. | |
| 8,017,469 B2 * | 9/2011 | Luo et al. | 438/216 |
| 2004/0038538 A1 * | 2/2004 | Ho et al. | 438/694 |
| 2005/0116290 A1 | 6/2005 | de Souza et al. | |
| 2005/0118764 A1 * | 6/2005 | Chou et al. | 438/275 |
| 2009/0068807 A1 | 3/2009 | Karve et al. | |

* cited by examiner

*Primary Examiner* — Kevin M Picardat
*Assistant Examiner* — Bac Au
(74) *Attorney, Agent, or Firm* — Scully, Scott, Murphy and Presser, P.C.; H. Daniel Schnurmann

(57) ABSTRACT

A method is provided that includes providing a semiconductor substrate including at least a thin gate oxide pFET device region and a thick gate oxide pFET device region and forming a thin gate oxide pFET within the thin gate oxide pFET device region and a thick gate oxide pFET within the thick gate oxide pFET device region. The thin gate oxide pFET that is formed includes a layer of SiGe on an upper surface of the thin gate oxide pFET device region, a high k gate dielectric located on an upper surface of the layer of SiGe, a pFET threshold voltage adjusting layer located on an upper surface of the high k gate dielectric, and a gate conductor material atop the pFET threshold voltage adjusting layer. The thick gate oxide pFET that is formed includes a thermal oxide located on an upper surface of the thick gate oxide pFET device region, a silicon layer located on an upper surface of the thermal oxide and a gate conductor material located atop the silicon layer.

20 Claims, 5 Drawing Sheets

THERMAL DUAL GATE OXIDE DEVICE INTEGRATION

BACKGROUND

The present invention relates generally to semiconductor devices and a method of fabricating the same. More particularly, the present invention relates to a thermal dual gate oxide nodule free SiGe-containing channel device and a method of fabricating the same.

In many instances, dual gate oxide (DGO) devices need to be integrated on the same substrate. As used herein, the term 'dual gate oxide devices' relates to devices that are formed on the same substrate, but have different gate oxide thicknesses. For example, thicker gate oxide devices may be formed on the periphery of the substrate so that they can handle higher voltages associated with input/output operations. Thinner gate oxide devices may be formed in areas of the substrate where higher voltages are not present.

A device including a metal gate and a high dielectric constant (high k) gate dielectric increasingly needs materials that may not be compatible with existing methods for forming dual gate oxide devices. For example, such metal gate/high k dielectric devices may need silicon germanium (SiGe) channels to lower the threshold voltage ($V_t$) associated with a pMOS device.

Conventional processes, such as thermal oxidation, used to form thick gate oxide devices, however, are not compatible with SiGe channels. This is because if thick gate oxide is grown over SiGe, the thermal oxidation step results in Ge diffusing into the regions of the substrate or the gate oxide that should not contain any Ge. In sum, a thermal oxidation step used as part of the conventional dual gate oxide integration process may degrade the profile of the SiGe channel.

Although there is a compatibility problem with thermal oxides and SiGe channels in prior art DGO devices, thermal oxides are of a better quality than deposited oxides. Specifically, thermal oxides provide an improved interface formation between the thermally grown oxide and the semiconductor substrate interface, little or no defects and improved oxide breakdown property as compared to deposited oxides.

SUMMARY

In one embodiment of the invention, a method is provided in which a thermal oxide is utilized as a dual gate oxide and the thermal oxide is formed prior to SiGe formation thus avoiding the problems associated with prior art DGO devices. Since the thermal oxide is formed prior to SiGe formation, the thermal oxidation can be applied without any restrictions and without adversely affecting the SiGe channel.

The method mentioned above includes providing a semiconductor substrate including at least a thin gate oxide pFET device region and a thick gate oxide pFET device region and forming a thin gate oxide pFET within the thin gate oxide pFET device region and a thick gate oxide pFET within the thick gate oxide pFET device region. The thin gate oxide pFET that is formed includes a layer of SiGe on an upper surface of the thin gate oxide pFET device region, a high k gate dielectric located on an upper surface of the layer of SiGe, a pFET threshold voltage adjusting layer located on an upper surface of the high k gate dielectric and a gate conductor material atop the pFET threshold voltage adjusting layer. In some embodiments of the invention, an nFET threshold voltage adjusting layer can be located between the pFET threshold voltage adjusting layer and the gate conductor material. The thick gate oxide pFET that is formed includes a thermal oxide located on an upper surface of the thick gate oxide pFET device region, a silicon layer located on an upper surface of the thermal oxide and a gate conductor material located atop the silicon layer.

In some embodiments of the method described above, a thick gate oxide nFET device region and a thin gate oxide nFET device region are provided within the semiconductor substrate, and a thick gate oxide nFET is formed within the thick gate oxide nFET device region, and a thin gate oxide nFET is formed within the thin gate oxide nFET device region. In such an embodiment, the thick gate oxide nFET includes a thermal oxide located on an upper surface of the thick gate oxide nFET device region, a silicon layer located on an upper surface of the thermal oxide, and a gate conductor material atop the silicon layer. The thin gate oxide nFET includes a high k gate dielectric located on an upper surface of the thin gate nFET device region, an nFET threshold voltage adjusting layer located on an upper surface of the high k gate dielectric, and a gate conductor material atop the nFET threshold voltage adjusting layer.

In another embodiment of the invention, a dual gate oxide structure is provided that is free of c-SiGe nodule formation, i.e., SiGe nucleation on weak spots. Specifically, a semiconductor structure is provided that includes a semiconductor substrate including at least a thin gate oxide pFET device region and a thick gate oxide pFET device region. A thin gate oxide pFET is located within the thin gate oxide pFET device region, and a thick gate oxide pFET is located within the thick gate oxide pFET device region. The thin gate oxide pFET includes a layer of SiGe on an upper surface of the thin gate oxide pFET device region, a high k gate dielectric located on an upper surface of the layer of SiGe, a pFET threshold voltage adjusting layer located on an upper surface of the high k gate dielectric, and a gate conductor material atop the pFET threshold voltage adjusting layer. In some embodiments, an nFET threshold voltage adjusting layer is located between the pFET threshold voltage adjusting layer and the gate conductor material. The thick gate oxide pFET includes a thermal oxide located on an upper surface of the thick gate oxide pFET device region, a silicon layer, which is typically conducting, located on an upper surface of the thermal oxide and a gate conductor material located atop the silicon layer. Typically, the silicon layer of the thick gate oxide pFET is thinner than the gate conductor material.

In some embodiments, the semiconductor structure further includes a thick gate oxide nFET device region and a thin gate oxide nFET device region located within the semiconductor substrate, wherein a thick gate oxide nFET is present within the thick gate oxide nFET device region, and a thin gate oxide nFET is present within the thin gate oxide nFET device region. In such an embodiment, the thick gate oxide nFET includes a thermal oxide located on an upper surface of the thick gate oxide nFET device region, a silicon layer, which is typically conducting, located on an upper surface of the thermal oxide, and a gate conductor material atop the silicon layer. Typically, the silicon layer of the thick gate oxide nFET is thinner than the gate conductor material. The thin gate oxide nFET includes a high k gate dielectric located on an upper surface of the thin gate oxide nFET device region, an nFET threshold voltage adjusting layer located on an upper surface of the high k gate dielectric, and a gate conductor material atop the nFET threshold voltage adjusting layer.

It is noted that the thick gate oxide devices are high voltage circuitry that can handle external supply voltage, while the thin gate oxide devices are used for higher performance logic regions. The thick gate oxide devices are typically located at end segments, e.g., periphery, of a semiconductor substrate, while the thinner gate oxide devices are located between the end segments.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
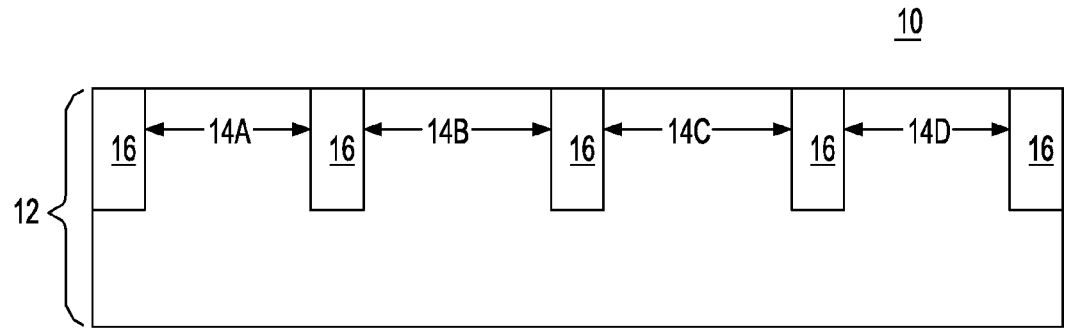
FIG. 1 is a pictorial representation (though a cross sectional view) of an initial structure that can be employed in one embodiment of the present invention which includes four different device regions.

An embodiment of the present invention will now be described in greater detail by referring to the following discussion and drawings that accompany the present application. The drawings of the present application, which are referred to herein below in greater detail, are provided for illustrative purposes and, as such, they are not drawn to scale. Reference is first made to FIG. 1 which illustrates an initial structure 10 that can be employed in one embodiment of the present invention. Specifically, the initial structure shown in FIG. 1 includes a semiconductor substrate 12 having at least four device regions 14A, 14B, 14C and 14D, that are separated from each other by an isolation region 16.

The four device regions shown include a first device region 14A in which a thick gate oxide nFET will be subsequently formed, a second device region 14B in which a thin gate oxide nFET will be subsequently formed, a third device region 14C in which a thin gate oxide pFET will be subsequently formed and a fourth device region 14D in which a thick gate oxide pFET will be subsequently formed. Although four different device regions are shown and described within this embodiment of the present invention, the present invention can be employed in embodiments in which a thin gate oxide pFET device region, e.g., device region 14C, and a thick gate oxide pFET device region, e.g., device region 14D, are the only device regions that are present. Note that the thick gate oxides device regions are located at end segments of the semiconductor substrate and the thin gate oxide device regions are located between the thick gate oxide device regions. Note also that the terms "thin gate oxide" and "thick gate oxide" are relative to each other.

The initial structure 10 shown in FIG. 1 can be formed by conventional methods and materials well known to those skilled in the art. For example, the semiconductor substrate 12 of the initial structure 10 may be comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In a preferred embodiment of the invention, the semiconductor substrate includes an SOI substrate in which top and bottom semiconductor material layers such as Si are spaced apart by a buried dielectric such as a buried oxide. In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

At least one isolation region, e.g., isolation region 16, is typically formed into the semiconductor substrate 12 so as to form active regions, i.e., device regions, within the substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The height of the trench isolation region may be adjusted by performing a wet etching process such as etching with HF. The field oxide may be formed utilizing a so-called local oxidation of silicon process. Note that the at least one isolation region 16 provides isolation between neighboring gate regions, typically required when the neighboring gates have opposite conductivities, i.e., nFETs and pFETs. The isolation region is typically present between the various device regions of the substrate, i.e., between first device region 14A, the second device region 14B, the third device region 14C and the fourth device region 14D.

The various device regions, e.g., active regions, may be doped by ion implantation processes to form well regions within the different device regions. For clarity, the well regions are not specifically shown in the drawings of the present application. The well regions for the pFET devices typically include an n-type dopant, and the well regions for the nFET devices typically include a p-type dopant. The dopant concentration of the well regions of the same conductivity type device may be the same or different. Likewise, the dopant concentration of the well regions of the different conductivity type may be the same or different.

Figure 2:
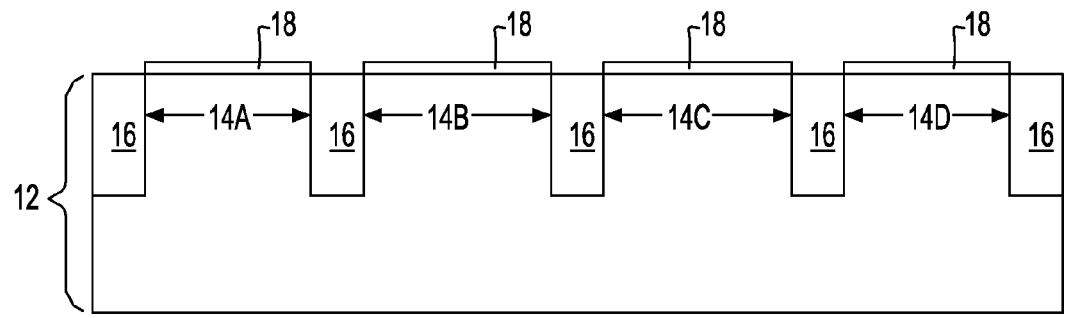
FIG. 2 is pictorial representation (though a cross sectional view) of the initial structure of FIG. 1 after formation of a thermal oxide on exposed surfaces within each of the four different device regions.

As shown in FIG. 2, a thermal oxide 18 is formed atop each of the different device regions shown in FIG. 1. The thermal oxide 18 is typically comprised of silicon oxide, silicon oxynitride or a multilayered stack thereof. In a preferred embodiment, the thermal oxide is comprised of silicon oxide. In other embodiments of the invention, other types of semiconductor oxides such as germanium oxide can be employed as the thermal oxide 18. The thermal oxide 18 can be formed by a thermal growth process such as a thermal oxidation process. In some embodiments of the invention, a thermal nitridation process can be performed prior to thermal oxidation so as to incorporate some nitride within the thermally grown oxide. The thermal oxide 18 typically has a thickness that is from 1 nm to 6 nm, with a thickness from 2 nm to 4 nm being even more typical. Note that the thermal oxide 18 has a thickness that is not necessary greater than the thickness of a subsequently formed high k dielectric material even though electrically equivalent thickness can be thicker to handle high voltage circuitry.

Figure 3:
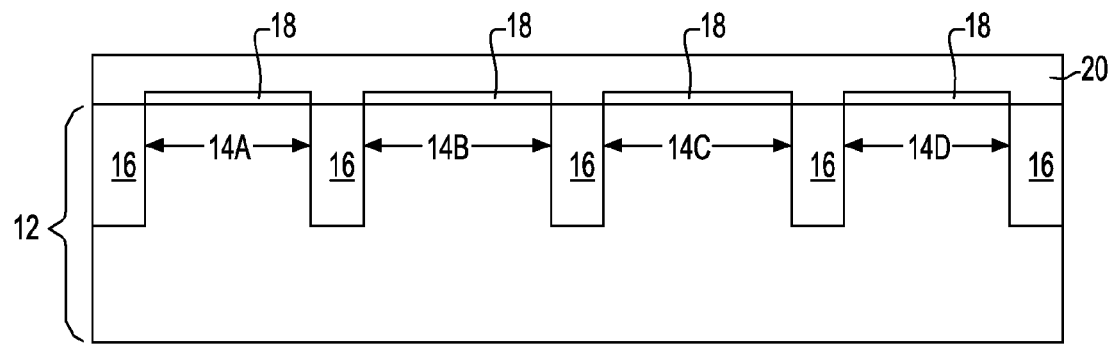
FIG. 3 is a pictorial representation (though a cross sectional view) of the structure shown in FIG. 2 after forming a silicon layer thereon.

After providing the structure shown in FIG. 2, a silicon layer 20 is formed atop all exposed surfaces of the structure shown in FIG. 2 including atop the thermal oxide 18 in each of the different device regions, e.g., 14A, 14B, 14C, and 14D, as well as atop the isolation region 16 that separates the various device regions. The resultant structure including the silicon layer 20 is shown, for example, in FIG. 3. The silicon layer 20 that is formed typically has a thickness from 1 nm to 20 nm, with a thickness from 3 nm to 10 nm being even more typical.

The silicon layer 20 may be amorphous silicon or polycrystalline silicon, with amorphous silicon being highly preferred in some embodiments of the invention for smoother surface topography. The silicon layer 20 can be formed utilizing any conventional deposition process including chemical vapor deposition (CVD) and plasma enhanced chemical vapor deposition (PECVD). In one embodiment of the present invention, the silicon layer 20 is formed by a low pressure (on the order of 0.3 Torr or less) CVD process using $SiH_4$ as a silicon precursor. In this particular embodiment of the invention, the low pressure CVD process is typically performed at a temperature from 500° C. to 550° C. Silicon layer 20 serves as a mask layer and as a part of the gate electrode of a transistor to be subsequently formed.

Figure 4:
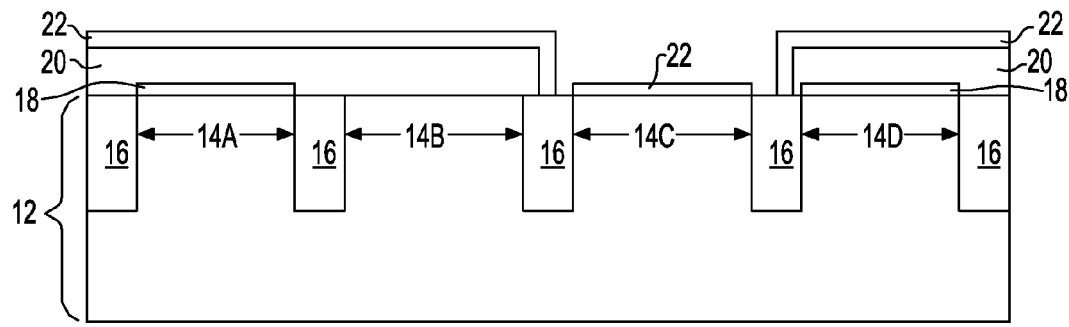
FIG. 4 is a pictorial representation (though a cross sectional view) of the structure shown in FIG. 3 after opening one of the device regions in which a thin gate oxide pFET is to be formed, removing the thermal oxide and forming a layer of SiGe on all exposed semiconductor surfaces.

FIG. 4 shows the resultant structure after opening the device region in which a thin gate oxide pFET, i.e., the third device region 14C, is to be subsequently formed, removal of the thermal oxide 18 therefrom and forming a layer of SiGe 22 on all exposed semiconductor surfaces. Specifically, the structure shown in FIG. 4 is formed by first opening the third device region 14C in which the thin gate oxide pFET is to be subsequently formed. The opening of the third device region 14C in which the thin gate oxide pFET is to be subsequently formed is carried out utilizing lithography and etching. The lithography step used in opening the third device region 14C includes forming a photoresist layer (not shown) on an upper surface of the silicon layer 20 of the structure shown in FIG. 3, exposing the photoresist layer to a desired pattern of radiation and developing the exposed resist with a conventional resist developer. Positive- or negative-tone photoresists can be used in opening the third device region 14C. After developing the pattern into the exposed photoresist, the pattern is transferred into the structure shown in FIG. 3 by dry etching, wet etching or a combination thereof. In a preferred embodiment of the invention, a dry etching process selected from reactive ion etching, plasma etching, ion beam etching and laser ablation can be used in opening the third device region 14C. When dry etching is employed, a dry etching process that selectively removes silicon as compared to oxide such as $Cl_2$ or $Br_2$ chemistry is employed. When a wet etch is employed, tetramethylammonium hydroxide (TMAH) may be used to selectively remove silicon as compared to oxide. In embodiments when TMAH is used, a hard mask layer (not shown) such as an oxide may be formed atop the silicon layer 20. It is noted that the patterned photoresist is typically removed after transferring the pattern into the underlying structure, i.e., after opening the third device region 14C, utilizing a conventional resist stripping process such as ashing.

After opening the third device region 14C, the thermal oxide 18 located atop the now exposed third device region 14C is removed by utilizing an etching process that selectively removes oxide compared with a semiconductor material, e.g., silicon. In one embodiment of the invention, a hydrofluoric (HF) acid solution, typically diluted in water, is used to removal the exposed thermal oxide. When an oxide hard mask is present, this etching step also removes the oxide hard mask from the structure as well.

After removing the thermal oxide 18 from the third device region 14C, a layer of SiGe 22 is formed on all exposed semiconductor surfaces including atop the now patterned silicon layer 20 and atop the now exposed third device region 14C. The layer of SiGe 22 is formed by selective epitaxial growth using conditions that are well known to those skilled in the art. For example, a $SiH_4$ precursor can be used as the silicon source and a $GeH_4$ precursor can be used as the source of Ge. The concentration of Ge can be varied depending on the device requirement. Typically, the Ge concentration with the layer of SiGe 22 is from 10 atomic % to 50 atomic %. The Si source precursor and the Ge source precursor may be diluted in hydrogen and growth of the layer of SiGe 22 may occur at a temperature from 500° C. to 700° C. $B_2H_6$ can be added to add a boron dopant to the layer of SiGe 22.

The thickness of the layer of SiGe 22 may vary depending also on the device requirement. Typically, the layer of SiGe 22 has a thickness from 1 nm to 20 nm, with a thickness from 3 nm to 10 nm being more preferred. It is noted that the layer of SiGe 22 on top of the third device region 14C, serves as a SiGe channel for a subsequently formed thin gate oxide pFET.

Figure 5:
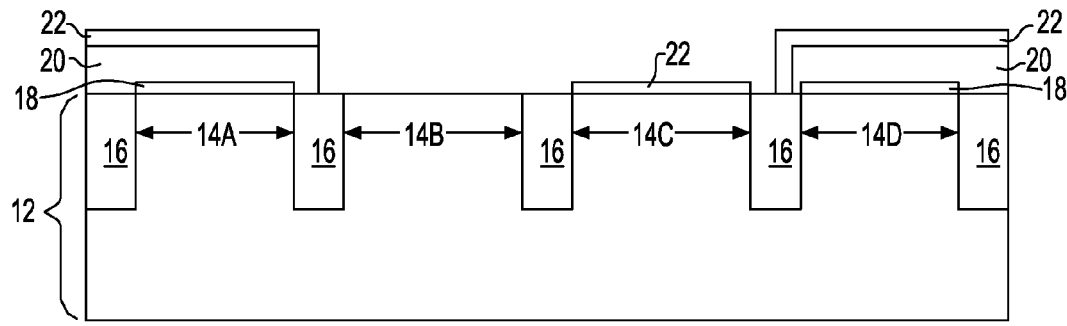
FIG. 5 is a pictorial representation (though a cross sectional view) of the structure shown in FIG. 4 after opening a device region in which a thin gate oxide nFET is to be formed and removal of the thermal oxide therefrom.

As shown in FIG. 5, the second device region 14B in which the thin gate oxide nFET is to be subsequently formed is opened and thereafter the exposed thermal oxide 18 is removed from the now exposed second device region 14B. The opening of the second device region 14B includes lithography and etching as described above for opening the third device region 14C. Removal of the thermal oxide 18 from the second device region 14B includes an etching process as described above for removing the thermal oxide 18 from the third device region 14C.

After opening the second device region 14B and removal of the thermal oxide 18 therefrom, the patterned resist used during the opening of the second device region 14B is typically stripped utilizing a conventional resist stripping process such as ashing.

Figure 6:
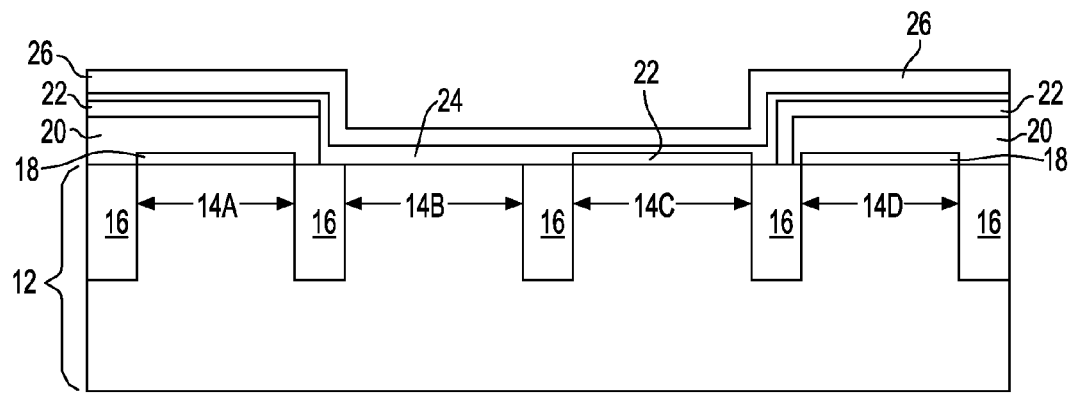
FIG. 6 is a pictorial representation (though a cross sectional view) of the structure shown in FIG. 5 after formation of a high k gate dielectric and a pFET threshold adjusting layer.

As shown in FIG. 6, a high k gate dielectric 24 and an overlying pFET threshold voltage adjusting layer 26 are formed on all exposed surfaces of the structure shown in FIG. 5 including atop the exposed second region 14B, the layer of SiGe 22 in the third device region 14C, and atop the silicon layer 20 that remains in both the first device region 14A and fourth device region 14D.

The high k gate dielectric 24 employed includes any dielectric metal oxide having a dielectric constant that is greater than the dielectric constant of silicon oxide, e.g., 3.9. Typically, the high k gate dielectric 24 that is employed has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 24. Each value of x is independently from 0.5 to 3 and each value of y is independently from 0 to 2.

The thickness of the high k gate dielectric 24 may vary depending on the technique used to form the same and it can be thicker than the thickness of the thermal oxide mentioned above. Typically, the high k gate dielectric 24 has a thickness from 2 nm to 10 nm, with a thickness from 3 nm to 6 nm being even more typical. The high k gate dielectric 24 employed may have an effective oxide thickness on the order of, or less than, 1 nm.

The high k gate dielectric 24 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

As is shown in FIG. 6, the pFET threshold voltage adjusting layer 26 is formed atop the high k gate dielectric 24. The pFET threshold voltage adjusting layer 26 includes any material that moves the threshold voltage of a pFET gate stack towards the pFET band edge. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively. Multilayered stacks of these materials can also be employed.

The pFET threshold voltage adjusting layer 26 can be formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), sputtering and plating. The pFET threshold voltage adjusting layer 26 has a thickness from 0.1 nm to 5.0 nm, with a thickness from 1.0 nm to 3.0 nm being even more typical.

In some embodiments of the present invention, a metal layer (not shown) is formed atop the pFET threshold voltage adjusting layer 26. In other embodiments of the present invention, the pFET threshold voltage layer 26 can be sandwiched between a bottom metal layer and a top metal layer. The metal layer or layers that can be used in such embodiments comprise any metallic material that is capable of conducting electrons. Specifically, the metal layer or metal layers that can be used in the aforementioned embodiments comprise a metal from Group IVB or VB of the Periodic Table of Elements. Nitrides and silicides of these metals can also be employed. Examples of preferred metals for the metal layer(s) include Ti, Zr, Hf, V, Nb or Ta, with Ti or Ta being highly preferred. In some embodiments, TiN or TaN are used as the metal layer(s), with a metal layer(s) of $Ti_xN_y$ where x is 0.5 to 1.5 and y is from 0.5 to 1.5, being highly preferred.

The physical thickness of the metal layer(s) may vary, but typically, the metal layer(s) has a thickness from about 0.5 to about 200 nm, with a thickness from about 5 to about 80 nm being more typical.

The metal layer(s) can be formed utilizing conventional deposition processes well known to those skilled in the art including, but not limited to sputtering, evaporation, chemical vapor deposition, and atomic layer deposition.

After forming the high k gate dielectric 24 and pFET threshold voltage adjusting layer 26 and optional the metal layer(s), the pFET threshold voltage adjusting layer 26 and, if present, the metal layer(s) are removed from the second device region 14B in which the thin gate oxide nFET is to be subsequently formed providing the structure shown in FIG. 7. Specifically, the pFET threshold adjusting layer 26 and, if present, the metal layer(s) are removed from the second device region 14B by forming a patterned resist (not shown) having an opening that exposes the second device region 14B. The patterned resist is formed by lithography as described above. The upper metal layer, if present, the pFET threshold voltage adjusting layer 26, and the lower metal layer, if present, are removed from the now exposed second device region utilizing an etching process that selectively etches the exposed metal layer(s), if present, and pFET threshold adjusting layer 26 while stopping atop the underlying high k gate dielectric 24. A wet etching process such as, for example, a low temperature (less than 60° C.) RCA SC1 may be employed. RCA SC1 clean is a well known industry standard clean. Typically, the RCA SC1 clean is performed at a temperature from 70° C.-80° C. using $NH_4OH:H_2O_2:H_2O$ at a 1:5:10 mixing ratio. Following the removal of the pFET threshold adjusting layer 26 from the second device region 14B, the patterned resist is typically stripped utilizing a conventional resist stripping process such as ashing.

Figure 7:
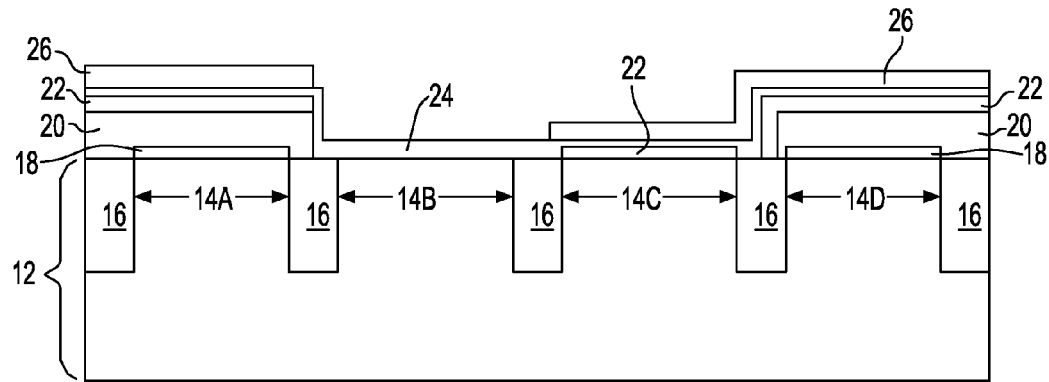
FIG. 7 is a pictorial representation (though a cross sectional view) of the structure shown in FIG. 6 after removing the pFET threshold adjusting layer from the device region in which a thin gate oxide nFET is to be formed.
Figure 8:
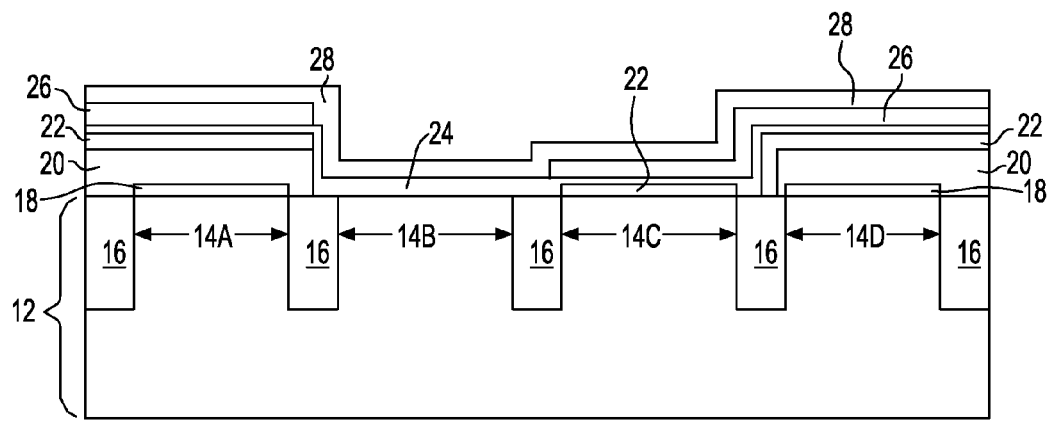
FIG. 8 is a pictorial representation (though a cross sectional view) of the structure shown in FIG. 7 after forming an nFET threshold voltage adjusting layer on all exposed surfaces.

FIG. 8 shows the structure of FIG. 7 after forming an nFET threshold voltage adjusting layer 28 on all exposed surfaces. The nFET threshold voltage adjusting layer 28 includes any material that moves the threshold voltage of an nFET gate stack towards the nFET band edge. One example of an nFET threshold voltage adjusting material that can be used as the nFET threshold voltage adjusting layer 28 is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ being more preferred.

The rare earth metal-containing material can be formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment of the present invention, the rare earth metal-containing material can be formed by placing the structure including the high k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is typically used. In the case of $La_2O_3$ deposition, the La evaporation cell is typically held within a specific temperature range such as, for example, 140° C.-170° C. and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1\times10^{-5}$ Torr to $8\times10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be employed as the nFET threshold voltage adjusting layer 28 is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. Alkaline earth metal-containing compounds that include a mixture of alkaline earth metals and/or a mixture of anions, such as an oxychloride can also be used as an nFET threshold voltage adjusting material. Examples of alkaline earth metal-containing compounds that can be used include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one prefer embodiment of the present invention, the alkaline earth metal-containing compound includes Mg. MgO is a highly preferred alkaline earth metal-containing material employed in one embodiment of the present invention.

The alkaline earth metal-containing material can be formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

Notwithstanding the type of material used as the nFET threshold voltage adjusting layer 28, the nFET threshold voltage adjusting layer 28 typically has a thickness from 0.1 nm to 5.0 nm, with a thickness from 1.0 nm to 3.0 nm being even more typical.

In some embodiments of the present invention, a metal layer can be formed atop the nFET threshold voltage adjusting layer 28 at this point of the invention. The metal layer used in such an embodiment is the same as that described above. For example, a metal layer comprising Ti, Ta, TiN or TaN can be formed atop the NFET threshold voltage adjusting layer 28.

Figure 9:
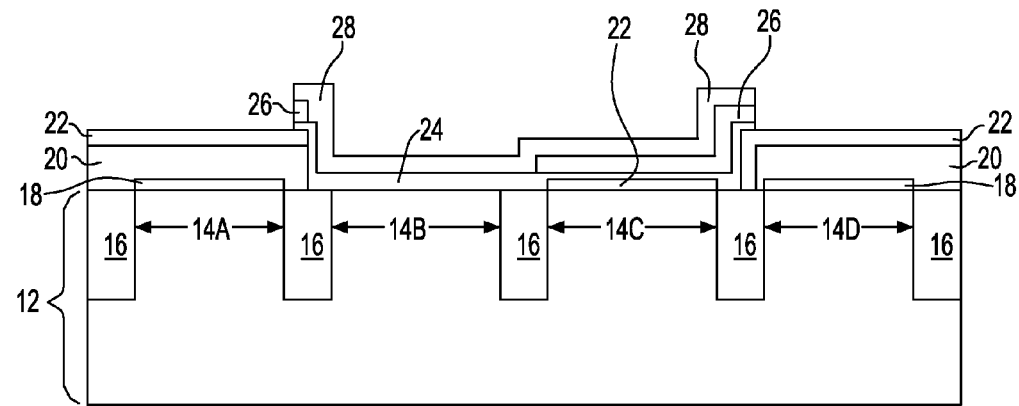
FIG. 9 is a pictorial representation (though a cross sectional view) of the structure shown in FIG. 8 after removing the nFET threshold adjusting layer, the pFET threshold voltage adjusting layer and the high k gate dielectric from the device regions in which a thick gate oxide nFET and a thick gate oxide pFET are to be formed.

As shown in FIG. 9, the nFET threshold adjusting layer 28, the pFET threshold voltage adjusting layer 26 and the high k gate dielectric 24 are each removed from the device regions in which a thick gate oxide nFET and a thick gate oxide pFET are to be formed, i.e., from the first device region 14A and the fourth device region 14D. This step includes first forming a patterned resist (not shown) that protects the second device region 14B and the third device region 14C. The patterned resist is formed by lithography and etching as described above. The nFET threshold adjusting layer 28, the pFET threshold voltage adjusting layer 26 and the high k gate dielectric 24 are then removed from the first device region 14A and the fourth device region 14D selective to the patterned resist stopping atop the layer of SiGe 22, utilizing one or more etching steps. The one or more etching steps may include dry etching, wet etching or any combination thereof. After removal of the nFET threshold adjusting layer 28, the pFET threshold voltage adjusting layer 26 and the high k gate dielectric 24 from the first and fourth device regions 14A and 14D, respectively, the patterned resist located atop the second and third device regions 14B and 14C, respectively is removed utilizing a conventional resist stripping process such as, for example, ashing.

In some embodiments of the present invention, the layer of SiGe 22 can be removed from atop the silicon layer 20 in both the first device region 14A and the fourth device region 14D. When this embodiment is employed, the layer of SiGe 22 can be removed from atop the silicon layer in both the first device region 14A and the fourth device region 14D by utilizing a selective etching process that selectively removes SiGe.

Figure 10:
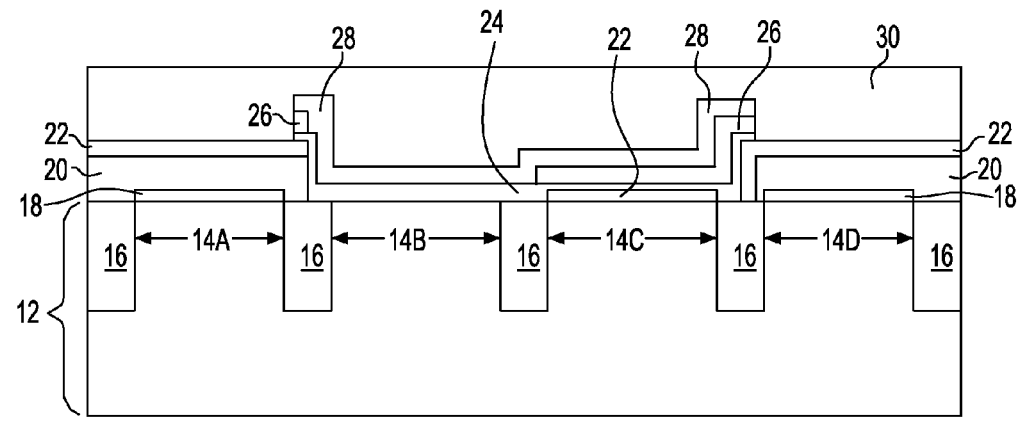
FIG. 10 is a pictorial representation (though a cross sectional view) of the structure shown in FIG. 9 after forming a gate conductor material on all exposed surfaces.

As shown in FIG. 10, a gate conductor material 30 is formed on all the exposed surfaces shown in FIG. 9. The gate conductor material 30 that is employed may comprise any conductive material including but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. Preferably, the gate conductor material includes polycrystalline silicon and nickel silicide that can be formed during S/D silicide process.

The gate conductor material 30 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate conductor material 30, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as deposited gate conductor material 30 typically has a thickness from 10 nm to 100 nm, with a thickness from 20 nm to 50 nm being even more typical.

After forming the gate conductor material 30, an optional hard mask material (not shown) can be formed atop the gate conductor material 30. The optional hard mask material may include an oxide, a nitride, an oxynitride or any combination thereof including multilayered stacks. When present the optional hard mask material is formed utilizing a conventional deposition process well known to those skilled in the art including, for example, CVD and PECVD. Alternatively, the optional hard mask material is formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being even more typical. The hard mask material is typically employed when the conductive material is a Si-containing material such as polysilicon or depending on subsequent processes such as an eSiGe process to protect any epitaxial nucleation on the gate material.

Figure 11:
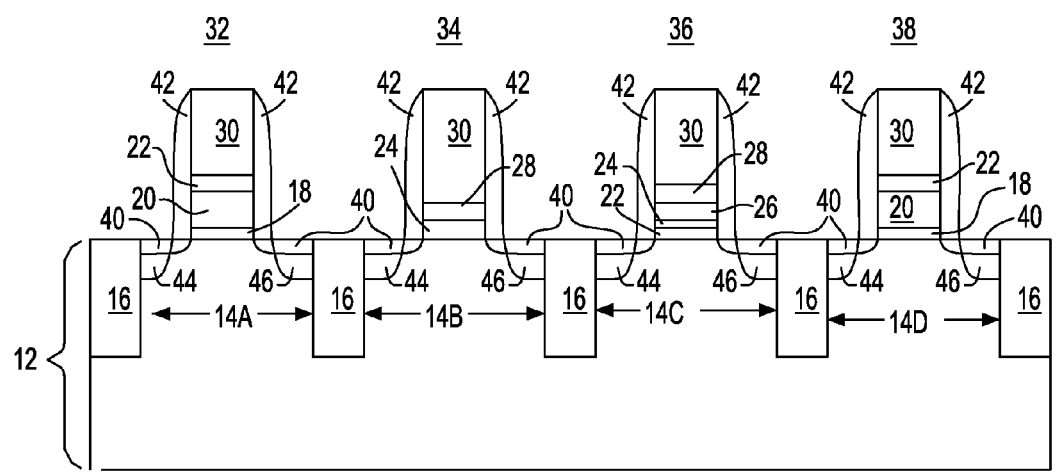
FIG. 11 is a pictorial representation (though a cross sectional view) of the structure shown in FIG. 10 after gate patterning, spacer formation and source and drain formation.

After forming the gate conductor material 30 and optionally the hard mask material, a gate patterning step including lithography and etching is performed to provide a thick gate oxide nFET 32, a thin gate oxide nFET 34, a thin gate oxide pFET 36 and a thick gate oxide pFET 38. See FIG. 11 which includes each of the gate stacks after patterning and further CMOS processing.

The thick gate oxide nFET 32, which is present in device region 14A, includes a thermal oxide 18 located on an upper surface of the device region 14A, a silicon layer 20 located on an upper surface of the thermal oxide 18, an optional layer of SiGe 22 located on an upper surface of the silicon layer 20, and a gate conductor material 30 located on either an upper surface of the optional layer of SiGe 22 or the upper surface of the silicon layer 20, if the optional layer of SiGe is not present.

The thin gate oxide nFET 34, which is present in device region 14B, includes a high k gate dielectric 26 located on an upper surface of the device region 14B, an nFET threshold voltage adjusting layer 28 located on an upper surface of the high k gate dielectric 26, an optional metal layer atop an upper surface of the nFET threshold voltage adjusting layer 28, and a gate conductor material 30 atop an upper surface of the metal layer, if present, or atop an upper surface of layer 28, if the metal layer is not present.

The thin gate oxide pFET 36, which is present in device region 14C, includes a layer of SiGe 22 atop an upper surface of the third device region 14C, a high k gate dielectric 26 located on an upper surface of the layer of SiGe 22, a pFET threshold voltage adjusting layer 26 located on an upper surface of the high k gate dielectric 26, an nFET threshold voltage adjusting layer 28 atop an upper surface of the pFET threshold voltage adjusting layer 26, and a gate conductor material 30 atop an upper surface of layer 28. Metal layers can be included in the thin gate oxide pFET 34 as described above. In some embodiments of the invention and when nFET devices are to be formed, the nFET threshold voltage adjusting layer is typically not present in the thin gate oxide pFET device.

The thick gate oxide pFET 38, which is present in device region 14D, includes a thermal oxide 18 located on an upper surface of the fourth device region 14D, a silicon layer 20 located on an upper surface of the thermal oxide 18, an optional layer of SiGe 22 located on an upper surface of the silicon layer 20, and a gate conductor material 30 located on either an upper surface of the optional layer of SiGe 22 or the upper surface of the silicon layer 20, if the optional layer of SiGe is not present.

After gate patterning, extension regions 40 can be formed into each of the device regions utilizing extension implants well known to those skilled in the art. After extension implantation, an optional activation step can be used to activate the extension regions 40. In some embodiments, the activation of the extension regions 40 can be delayed. After implanting the extension regions 40, an optional spacer 42 is formed on each of the vertical surfaces of the gate stacks. The optional spacer 42 is typically formed by deposition of an insulating material, such as an oxide and/or nitride, and etching. In some embodiments, a single spacer is formed. In other embodiments, a dual spacer can be formed. In yet a further embodiment, no spacer is formed. Next, a deep source region 44 and a deep drain region 46 are formed utilizing a conventional ion implantation process well known in the art. The deep source and drain regions can be activated after the ion implantation process, or they can be activated during a later thermal step, such as during deposition of a dielectric material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

providing a semiconductor substrate including at least a thin gate oxide pFET device region and a thick gate oxide pFET device region;

forming a thin gate oxide pFET within said thin gate oxide pFET device region and a thick gate oxide pFET within said thick gate oxide pFET device region, wherein said thin gate oxide pFET includes a layer of SiGe on an upper surface of said thin gate oxide gate pFET device region, a high k gate dielectric located on an upper surface of the layer of SiGe, a pFET threshold voltage adjusting layer located on an upper surface of the high k gate dielectric, and a gate conductor material atop the pFET threshold voltage adjusting layer, and said thick gate oxide pFET includes a thermal oxide located on an upper surface of the thick gate oxide pFET device region, a silicon layer located on an upper surface of the thermal oxide and a gate conductor material located atop the silicon layer.

2. The method of claim 1 wherein said semiconductor substrate further comprising a thick gate oxide nFET device region and a thin gate oxide nFET device region located within said semiconductor substrate.

3. The method of claim 2 further comprising forming a thick gate oxide nFET within said thick gate oxide nFET device region and a thin gate oxide nFET within said thin gate oxide nFET device region, wherein said thick gate oxide nFET includes a thermal oxide located on an upper surface of the thick gate oxide nFET device region, a silicon layer located on an upper surface of the thermal oxide, and a gate conductor material atop the silicon layer, and said thin gate oxide nFET includes a high k gate dielectric located on an upper surface of the thin gate oxide nFET device region, an nFET threshold voltage adjusting layer located on an upper surface of the high k gate dielectric, and a gate conductor material atop the nFET threshold voltage adjusting layer.

4. The method of claim 3 further comprising providing a SiGe layer located between the gate conductor material and the silicon layer in both the thick gate oxide pFET and the thick gate oxide nFET.

5. The method of claim 2 further comprising providing isolation regions between each of the different device regions.

6. The method of claim 2 wherein said thermal oxide is formed prior to forming the layer of SiGe.

7. A method of forming a semiconductor structure comprising:
providing a semiconductor substrate including at least a thin gate oxide pFET device region and a thick gate oxide pFET device region;
forming a thermal oxide on an upper surface of each of the device regions;
forming a patterned silicon layer atop the semiconductor substrate, said patterned semiconductor layer having an opening that exposes the thin gate oxide pFET device region;
removing the thermal oxide from atop the thin gate oxide pFET device region;
forming a layer of SiGe on the upper surface of the thin gate oxide pFET device region and on exposed surfaces of the patterned silicon layer;
selectively providing a high k gate dielectric and a p-type threshold voltage adjusting layer atop the layer of SiGe located on the upper surface of the thin gate oxide pFET device region;
forming a gate conductor material in each of the device regions, and
forming a thin gate oxide pFET within said thin gate oxide pFET device region and a thick gate oxide pFET within said thick gate oxide pFET device region, wherein said thin gate oxide pFET includes said layer of SiGe on the upper surface of said thin gate oxide pFET device region, the high k gate dielectric on an upper surface of the layer of SiGe, the pFET threshold voltage adjusting layer located on an upper surface of the high k gate dielectric, and the gate conductor material atop the pFET threshold voltage adjusting layer, and said thick gate oxide pFET includes the thermal oxide located on an upper surface of the thick gate oxide pFET device region, the silicon layer located on an upper surface of the thermal oxide, the layer of SiGe located atop the silicon layer, and the gate conductor material located atop the layer of SiGe.

8. The method of claim 7 further comprising removing the layer of SiGe from the thick gate oxide pFET device region.

9. A semiconductor structure comprising:
a semiconductor substrate including at least a thin gate oxide pFET device region and a thick gate oxide pFET device region;
a thin gate oxide pFET located within said thin gate oxide pFET device region, said thin gate oxide pFET includes a layer of SiGe on an upper surface of said thin gate oxide pFET device region, a high k gate dielectric located on an upper surface of the layer of SiGe, a pFET threshold voltage adjusting layer located on an upper surface of the high k gate dielectric, and a gate conductor material atop the pFET threshold voltage adjusting layer; and
a thick gate oxide pFET located within said thick gate oxide pFET device region, said thick gate oxide pFET includes a thermal oxide located on an upper surface of the thick gate oxide pFET device region, a silicon layer located on an upper surface of the thermal oxide and a gate conductor material located atop the silicon layer.

10. The semiconductor structure of claim 9 further comprising a thick gate oxide nFET device region and a thin gate oxide nFET device region located within said semiconductor substrate, wherein a thick gate oxide nFET is present within the thick gate oxide nFET device region, and a thin gate oxide nFET is present within said thin gate oxide nFET device region.

11. The semiconductor structure of claim 10 wherein said thick gate oxide nFET includes a thermal oxide located on an upper surface of the thick gate oxide nFET device region, a silicon layer located on an upper surface of the thermal oxide, and a gate conductor material atop the silicon layer, and said thin gate oxide nFET includes a high k gate dielectric located on an upper surface of the thin gate oxide nFET device region, an nFET threshold voltage adjusting layer located on an upper surface of the high k gate dielectric, and a gate conductor material atop the nFET threshold voltage adjusting layer.

12. The semiconductor structure of claim 11 further comprising a SiGe layer located between the gate conductor material and the silicon layer in both the thick gate oxide pFET and the thick gate oxide nFET.

13. The semiconductor structure of claim 12 wherein said nFET threshold voltage adjusting layer is an alkaline earth metal containing compound comprising a compound of the formula $MA_x$ wherein M is an alkaline earth metal, A is one of O, S and a halide and x is 1 or 2.

14. The semiconductor structure of claim 10 wherein said pFET threshold adjusting layer comprises Al and Ge, or compounds of Al, Ge, Ti and Ta that are non-conductive.

15. The semiconductor structure of claim 10 wherein said nFET threshold voltage adjusting layer comprises a rare earth metal containing compound, or an alkaline earth metal-containing material.

16. The semiconductor structure of claim 15 wherein said nFET threshold adjusting layer is a rare earth metal containing compound comprising an oxide or nitride of an element from Group IIIB of the Periodic Table of Elements.

17. The semiconductor structure of claim 10 wherein said high k gate dielectric comprising $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein x is independently from 0.5 to 3 and each value of y is independently from 0 to 2.

18. The semiconductor structure of claim 10 wherein said gate conductive material is comprised of polycrystalline silicon, polycrystalline silicon germanium, an elemental metal, an alloy of at least one elemental metal, an elemental metal nitride, and elemental metal silicide or a multilayer thereof.

19. The semiconductor structure of claim 10 further comprising an isolation region separating each of the device regions from each other.

20. The semiconductor structure of claim 10 wherein and an n-type threshold voltage layer is present between the pFET threshold voltage adjusting layer and the gate conductor material in the thin gate oxide pFET.

* * * * *